Jan. 14, 1969 L. J. POLLOCK 3,421,205

FABRICATION OF STRUCTURES FOR SEMICONDUCTOR INTEGRATED CIRCUITS

Filed April 14, 1965

WITNESSES

Theodore F. Wrobel

Leon M. Garman

INVENTOR

Larry J. Pollock

BY Gordon H. Telfer

ATTORNEY 3,421,205

FABRICATION OF STRUCTURES FOR SEMICONDUCTOR INTEGRATED CIRCUITS

Larry J. Pollock, Odenton, Md., assignor to Westinghouse Electric Corporation, Pittsburgh, Pa., a corporation of Pennsylvania Filed Apr. 14, 1965, Ser. No. 448,120
U.S. Cl. 29—580 4 Claims
Int. Cl. H01l 5/00; H01l 7/02

ABSTRACT OF THE DISCLOSURE

This invention relates to a method of forming a plurality of electrically isolated bodies of semiconductor material disposed upon and electrically isolated from a support member.

Figure 1:
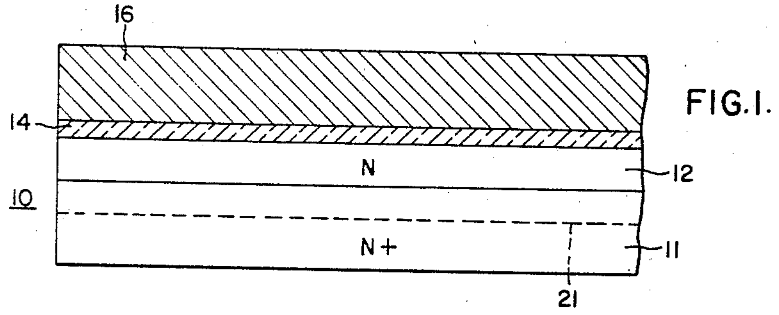

The method includes forming a layer of insulating material on one surface of a body of semiconductor material and thereafter forming a layer of support material on the layer of insulating material. Dividing the body of semiconductor material into a plurality of isolated bodies, forming a layer of insulating material and another support layer on the isolated bodies and removing the first insulation layer and support layer.

This invention relates generally to semiconductor devices and methods for their fabrication and, more particularly, to techniques for fabricating semiconductor integrated circuits having internal isolation provided by a dielectric medium.

It has been previously proposed to use a dielectric medium such as silicon dioxide to provide isolation between portions of a semiconductor integrated circuit. Considerable improvement in performance and increased design flexibility through lower parasitic capacitance and higher breakdown voltage can be the result compared to the use of back-to-back P–N junctions for isolation.

For further information on prior proposals for dielectric isolation in semiconductor integrated circuits, reference should be made to copending application, Ser. No. 410,666, filed Nov. 12, 1964, now abandoned by Murphy et al. and Ser. No. 444,208, filed Mar. 31, 1965, by Joyce, both of which applications are assigned to the present assignee.

The prior proposals are generally characterized by requiring a precisely controlled single crystal removal step with tolerances within about 1 micron to form the final device surface onto which high quality planar transistors and other components are to be fabricated. Such tolerances are about an order of magnitude more precise than was previously attainable in production operations. Furthermore, the problem is complicated by the fact that other operations, such as isolation channel etching and vapor deposition growth must also be performed to a high degree of accuracy.

It is, therefore, an object of the present invention to provide an improved method of fabricating semiconductor integrated circuits having dielectric isolation.

Another object is to provide a method of fabricating semiconductor integrated circuits with dielectric isolation wherein material removal operations are less critical than in prior proposals.

Another object is to provide an improved method of fabricating semiconductor integrated circuits compatible with existing techniques and equipment.

Briefly, the present invention achieves the abovementioned and additional objects and advantages through a method wherein there is formed on a unitary semiconductor body a first layer of insulating material and a first support member of vapor deposited semiconductor material following which the unitary body is separated into a plurality of isolated portions and the exposed surface is covered with a second layer of insulating material and a second support member of vapor deposited semiconductor material. The first support member is then removed to expose the surface of the plurality of isolated portions. Consequently, the removal step found critical in prior techniques is avoided as the first support member may be removed in its entirety down to the first insulating layer in a relatively easy operation.

The present invention together with the abovementioned and additional objects and advantages thereof will be better understood by reference to the following description taken with the accompanying drawing, wherein:

FIGURES 1 to 5 are partial sectional views of a semiconductor integrated circuit at successive fabrication stages illustrating the practice of the present invention.

The description herein illustrates the practice of the present invention particularly as applied to silicon semiconductive material and silicon dioxide insulating layers and other aspects of well known silicon technology. It will be recognized that other semiconductive and insulating materials and techniques may be used. Also, the semiconductor type of the various regions may be reversed from that shown by way of example.

Referring to FIG. 1, a body of starting material 10 that is approximately 8 mils thick is used that has N+ (highly doped) and N type layers 11 and 12 so as to provide in the ultimate structure the desired collector geometry in the transistors (or diodes). The N+ substrate 11 may have an initial thickness of a few mils for convenience in handling. It is subsequently reduced in thickness to about 5 microns. The N type layer 12 has a thickness of about 10 microns. N type layer 12 may be epitaxially grown on the N+ substrate. Alternatively, N+ and N type layers may both be epitaxially grown on other substrates, such as a body of P type conductivity.

A layer 14 of insulating material, silicon dioxide, is formed over the surface of the epitaxial layer 12 and a body 16 of vapor deposited semiconductor material, hereinafter called polycrystalline material although its crystallinity is not critical, with a thickness of about 6 mils is formed over the oxide to provide a mechanical support. The oxide layer 14 preferably includes a portion of thermal oxide on the substrate and then a portion of pyrolytic oxide. It will be noted that the steps of epitaxial growth for layer 12, pyrolytic oxide formation for layer 14 and the formation of polycrystalline body 16 may all be performed in a single reactor.

Next the N substrate 10 is chemically or mechanically removed to the desired dimensions by a lapping technique involving the removal of 2 to 3 mils of the starting material. This controlled removal operation, reducing the body to a position in a plane indicated as 21, determines the ultimate thickness of the single crystal material in the final device portions. Thus it should be controlled but need not be within critical limits. The thickness and desirable surface qualities of the layer 12, that should be suitable for oxide diffusion masking, are readily achieved in the epitaxial growth operation.

Figure 2:
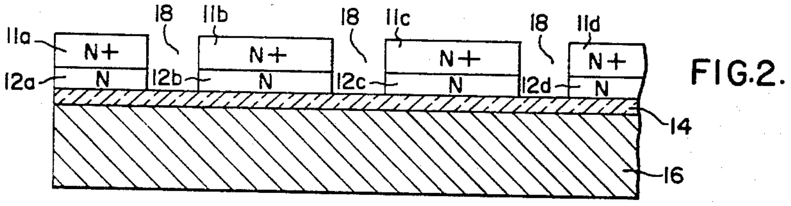

The resulting structure is masked and etched by conventional techniques to form the structure illustrated in FIG. 2 (inverted from the view of FIG. 1). The grooves 18 separate the single crystal material of layers 11 and 12 into a plurality of separate portions 11*a*–12*a*, 11*b*–12*b*, 11*c*–12*c* and 11*d*–12*d*. Note that this step is noncritical because the etching proceeds through all of the starting material and will virtually stop when it reaches the layer 14 of pyrolytic oxide, unlike the grooves necessary in prior processes.

Figure 3:
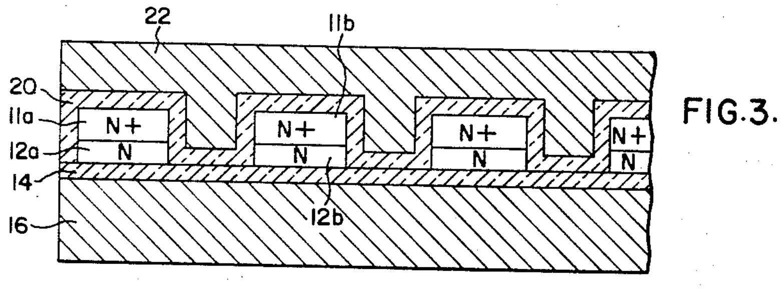

FIG. 3 shows the structure after an additional layer 20 of insulating material has been formed over the exposed surface of the discrete device portions. An additional body 22 of polycrystalline material of suitable thickness is formed over the insulating layer 20.

Figure 4:
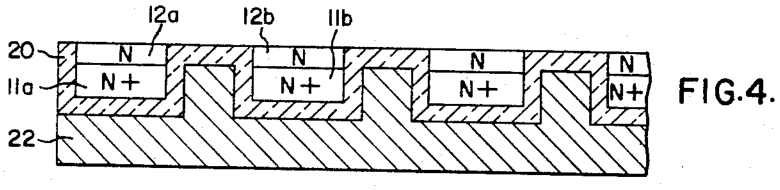

The first support member 16 and oxide layer 14 are removed to leave the finished body as shown in FIG. 4 (inverted from the views of FIGS. 2 and 3). Note that the oxide 14 allows the etching of the first polycrystalline body 16 to be noncritical as the oxide will effectively act as a stopping layer and limit further etching. The oxide can then be removed and devices can be fabricated using normal processing techniques to form transistors or resistors or other component structures. The oxide layer 14 may be retained if desired and used to form diffusion masks.

Figure 5:
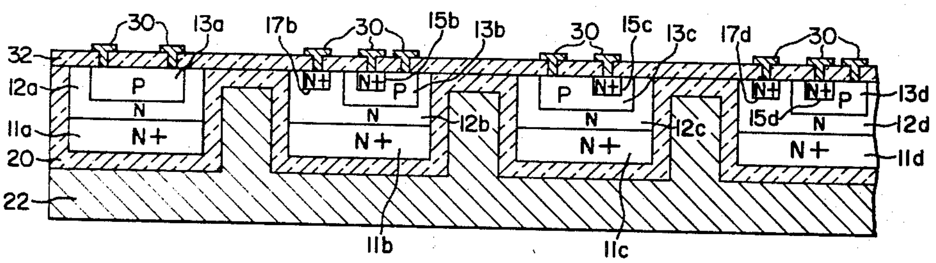

An example of a completed integrated circuit is shown in FIG. 5. By selective diffusion techniques using oxide masks, electronic elements are formed in each of the isolated device portions. P type regions 13*a*, 13*b*, 13*c* and 13*d* may be formed in a single diffusion operation followed by a diffusion to form N+ regions 15*b*, 15*c*, 15*d*, 17*b* and 17*d* after which ohmic contacts 30 are applied as necessary. Conductive interconnections (not shown) are also applied over the surface of the surface passivating oxide layer 32 to interconnect the various functional elements into the desired circuit. Region 13*a* thus provides a resistance; regions 15*b*, 13*b* and 12*b* a transistor; regions 15*c* and 13*c* a diode; and regions 15*d*, 13*d* and 12*d* another transistor. These are, of course, merely exemplary of the possible functional elements. In general, the structures used for functional elements in prior integrated circuits having P–N junction isolation may be used in the practice of this invention.

In accordance with this technique the growth of epitaxial layers is only as critical as in prior technology. All of the steps which differ from conventional techniques for forming integrated circuits with diffused isolation junctions are non-critical and easily accomplished. The surface treatment that the epitaxial layer requires need only be that presently practiced. Furthermore, any undercutting that occurs in the etching of channels for isolation will not affect the surface dimension. The structure is thoroughly compatible with existing techniques for fabricating high quality transistors having a low saturation resistance as the low resistivity material 11 is easily included as may a low resistivity collector wall in accordance with the teachings of copending application Ser. No. 353,524, filed Mar. 20, 1964, now Patent No. 3,341,755 by J. D. Husher and L. J. Pollock and assigned to the assignee of the present invention.

There will now be described a more specific example of the practice of the present invention. Where appropriate, reference is made to FIGS. 1 to 5 by reference numerals. The starting material was a body of monocrystalline P type silicon with a resistivity in the range of from about 10 to 40 ohm-centimeters and a thickness of about 8 mils. The major surfaces were oriented about 1.5° off the <111> plane. One of the major surfaces of the starting material was prepared for epitaxial deposition in accordance with known techniques and a highly doped N type epitaxial layer 11 was grown thereon having a thickness of about 5.5 microns and a resistivity of about 0.03 ohm-centimeter. Then, in the same reactor, an N type epitaxial layer 12 was grown having a thickness of about 10 microns and a resistivity of about 0.35 ohm-centimeter. Following the epitaxial growth the surface of the body was oxidized by thermal oxidation to form an oxide layer of about 8,000 angstroms. Additionally a layer of about 6,000 angstroms of pyrolytically deposited silicon was deposited to form layer 14. There was then formed on the surface of the oxide layer a quantity of vapor deposited silicon to a thickness of about 150 microns to form support 16. The wafer was then lapped from the polycrystalline side to a thickness of about 11 mils and then lapped from the single crystal side to a thickness of about 8.5 mils.

Then employing conventional etching techniques, the isolation grooves 18 were etched using a float-etching process, following which there were formed on the exposed surfaces 8,000 angstroms of pyrolytic silicon dioxide and a layer 22 of polycrystalline material to a thickness of about 150 microns. The first layer 16 of polycrystalline semiconductor material was removed to the first layer of silicon dioxide using an etchant comprising the following constituents (in concentrated solution) by volume:

| | Percent |
|---|---|
| $HNO_3$ | 75 |
| HF | 12.5 |
| $CH_3COOH$ | 12.5 |

used at a temperature of 25° C. with mechanical agitation. The etchant composition is not critical.

The exposed oxide is then suitable for masking diffusions into the single crystal material to form the integrated circuit components in conventional fashion.

While the invention has been shown and described in a few forms only, it will be understood that various modifications may be made without departing from the spirit and scope thereof.

What is claimed is:

1. In a method of preparing a semiconductor device structure suitable in making an integrated circuit, the steps comprising: obtaining a unitary semiconductor body; forming a first layer of insulating material on a surface of said body; forming a first support member of vapor deposited semiconductor material on said first layer of insulating material; seperating said unitary semiconductor body into a plurality of isolated bodies by completely removing selected portions of the semiconductor body to expose the first layer of insulating material, said isolated bodies being disposed on said first support member; forming a second layer of insulating material on the exposed surfaces of said isolated bodies and the exposed portions of said first layer of insulating material; forming a second support member of vapor deposited semiconductor material on said second layer of insulating material; and removing said first support member and all of the first layer of insulating material.

2. A method as defined in claim 1 wherein: said unitary semiconductor body is of monocrystalline silicon; said first and second layers of insulating material comprise pyrolytically deposited silicon dioxide; said separating of said unitary body and said removing of said first support member are performed by employing an etchant that attacks said semiconductor body and said first support member at a rate greater than it attacks said insulating material; said first and second support members are of polycrystalline silicon deposited from a vapor.

3. In a method as defined in claim 1, the additional step comprising: forming at least one electronic element in each of said isolated portions.

4. A method as defined in claim 1 wherein: said unitary semiconductor body comprises a first layer of semiconductive material and a second layer of semiconductive material of the same semiconductivity type as said first layer of a resistivity greater than that of said first layer; and said first layer of insulating material is formed on a surface of said second layer of semiconductive material.

(References on following page)

References Cited

UNITED STATES PATENTS

| | | | |
|---|---|---|---|
| 3,158,505 | 11/1964 | Sandor | 117—215 |
| 3,158,788 | 11/1964 | Last | 317—101 |
| 3,189,973 | 6/1965 | Edwards | 148—174 |
| 3,290,753 | 12/1966 | Chang | 29—577 |
| 3,290,760 | 12/1966 | Cave | 29—581 |
| 3,300,832 | 1/1967 | Cave | 29—580 |
| 3,307,239 | 3/1967 | Lepselter | 29—577 |

WILLIAM I. BROOKS, *Primary Examiner.*

U.S. Cl. X.R.

29—578; 148—175; 317—235